United States Patent
Yu et al.

[19]

[11] Patent Number: 6,093,647
[45] Date of Patent: Jul. 25, 2000

[54] METHOD TO SELECTIVELY ELECTROPLATE CONDUCTIVE MATERIAL INTO TRENCHES

[75] Inventors: Allen S. Yu, Fremont; Paul J. Steffan, Elk Grove, both of Calif.

[73] Assignee: Advanced Micro Devices, Inc., Sunnyvale, Calif.

[21] Appl. No.: 09/186,053

[22] Filed: Nov. 3, 1998

[51] Int. Cl.$^7$ .................................................. H01L 21/44
[52] U.S. Cl. ........................... 438/687; 438/643; 438/644; 438/653; 438/654; 438/672; 438/674; 438/675; 438/678
[58] Field of Search .................................... 438/687, 678, 438/674, 675, 672, 644, 654, 643, 653, 677, 466

[56] References Cited

U.S. PATENT DOCUMENTS 5,342,806  8/1994  Asahina ................................. 437/195
5,933,758  8/1999  Jain ....................................... 438/687

*Primary Examiner*—John F. Niebling
*Assistant Examiner*—Lynne A. Gurley
*Attorney, Agent, or Firm*—H. Donald Nelson

[57] ABSTRACT

A method of filling trenches in a semiconductor wafer with a conductive material is disclosed by selectively electroplating the semiconductor wafer. The trenches are lined with a barrier layer and a seed layer and the semiconductor wafer is submerged in a solution having ions of the selected conductive material. An electrical potential is applied to the electroplating solution and the semiconductor wafer. The seed layer in the trench causes the conductive material ions to be plated in the trench.

4 Claims, 5 Drawing Sheets

METHOD TO SELECTIVELY ELECTROPLATE CONDUCTIVE MATERIAL INTO TRENCHES

BACKGROUND OF THE INVENTION

1. Field of the Invention

This invention relates generally to a method of filling a cavity with a conductive material. More particularly, this invention relates to a method of filling a cavity in regions of a semiconductor wafer wherein electrical wiring are to be made. Even more particularly, this invention relates to a method of filling a cavity with a conductive material such gold, copper, tungsten and nickel.

2. Discussion of the Related Art

The increased demand for higher performance semiconductor devices has required the density of metallization lines to be increased and in addition has required the addition of stacked layers. These requirements have necessitated the development of novel approaches in the methods of forming interconnections that not only integrate fine geometry definition but are also conducive to subsequent CMP (chemical mechanical polishing) processing. As the interconnection line widths shrink, the challenges of etching material using photoresist-as-mask techniques have become increasingly difficult.

Traditional methods of forming interconnection structures include the use of photoresist patterning and chemical or plasma "subtractive" etching as the primary metal-patterning technique. However, as the geometry of the semiconductor circuits continues to decrease, traditional interconnection materials are unsuitable. For example, aluminum interconnections with reduced line width results in greater resistance and heat. The increased heat causes the aluminum to melt. The use of copper, gold, silver and nickel is called for because they have low resistance and thinner lines can be used without detrimental heating. Additional difficulties in the traditional method include the trapping of impurities or volatile materials, such as aluminum chloride, in the inter-wiring spaces, which may pose reliability risks to the device, leaving residual metal stringers, which may cause electrical shorts, residual photoresist, and poor step coverage. These problems contribute to low yields and necessitate relaxed design rules that result in low layout density.

Current integrated circuit devices with multiple levels of wiring require conductive material to be filled into small trenches or vias. One favorite technique employs a global deposition or sputtering of the conductive material over the entire surface of the wafer. A blanket etch back process removes the unwanted material from the non-trench or non-via regions leaving the trenches or vias filled with the conductive material. The disadvantages of this method are poor step coverage, residual conductive material left in the non-trench regions, and relatively large recessions or dimples directly above the trench or via areas.

A newer technique to eliminate the above problems utilizes a chemical mechanical polish (CMP) after the global deposition or plating of conductive material. Although this method works well with some metals, such as aluminum and tungsten, too much waste is involved. Moreover, aluminum is not easily polished with a chemical mechanical polish process because it is a relatively soft material that molts onto the harder oxide. This leaves large amounts of aluminum in the non-trench region and causes the device to short. In some cases, the topography is so extreme that a reverse mask process must be used to protect the recessed areas and an isotropic etch is utilized to reduce the peaks over the non-trench regions so that the CMP process can achieve a uniform surface. Since it is difficult to dry etch non-aluminum metals, a corrosive (acid) or a reverse plating method with a reverse mask is used to remove the peaks. All of these complicate the process.

Therefore, what is needed is a method to fill cavities in semiconductor wafers with a conductive material that does not require extensive polishing if any at all.

SUMMARY OF THE INVENTION

The present invention overcomes the above problems of prior art method of filling cavities such as trenches in a semiconductor wafer and provides other additional advantages through a method of filling cavities by electroplating.

In accordance with an aspect of the invention, cavities are formed in a layer of the semiconductor wafer. A barrier layer and a seed layer are formed on the surface of the cavities. The seed layer is formed from a material that will form the base for a subsequent electroplating process. The semiconductor wafer is submerged in an electroplating solution. A potential is applied between the electroplating solution and the semiconductor wafer.

In accordance with another aspect of the invention the electroplating solution includes $Cu^{++}$.

In accordance with another aspect of the invention the barrier layer is formed from a material such as tantalum nitride or other metallic nitride In accordance with another aspect of the invention the seed layer is formed from a material such as copper.

The described method provides an economical method of filling cavities such as trenches in semiconductor wafers.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIGS. 1A–1F illustrate a present method of filling a cavity such as a trench with a conductive material; wherein FIG. 1A shows a portion of the top portion of a layer in a semiconductor wafer showing a single cavity that is to be filled with a conductive material and wherein the cavity is lined with a barrier layer and a seed layer;

FIG. 1B shows the portion of the top portion of the semiconductor wafer as shown in FIG. 1A with a layer of conductive material deposited on the surface of the semiconductor wafer including filling the cavity and with a recess in the conductive material over the trench;

FIG. 1C shows the portion of the top portion of the semiconductor wafer as shown in FIG. 1B with photoresist filling the recess in the conductive material over the trench;

FIG. 1D shows the portion of the top portion of the semiconductor wafer as shown in FIG. 1C after an etch process to etch a portion of the conductive material;

FIG. 1E shows the portion of the top portion of the semiconductor wafer as shown in FIG. 1D with the photoresist removed;

FIG. 1F shows the portion of the top portion of the semiconductor wafer as shown in FIG. 1D after a planarization process that removes the excess conductive material down to the surface of the semiconductor wafer;

FIGS. 2A–2D illustrate a method of filling a cavity such as a trench with a conductive material in accordance with the present invention; wherein FIG. 2A shows a portion of the top portion of a semiconductor wafer showing a single cavity that is to be filled with a conductive material and wherein the cavity is lined with a barrier layer and a seed layer;

FIG. 2B shows the portion of the top portion of the semiconductor wafer as shown in FIG. 2A with the portions of the barrier layer and seed layer removed from the top surface of the semiconductor wafer;

FIG. 2C shows the portion of the top portion of the semiconductor wafer as shown in FIG. 2B in an electroplating solution; and FIG. 2D shows the portion of the top portion of the semiconductor wafer as shown in FIG. 2C with the cavity filled with a conductive material.

DETAILED DESCRIPTION

Reference is now made in detail to specific embodiments of the present invention which illustrate the best mode presently contemplated by the inventors for practicing the invention.

Figure 1A:
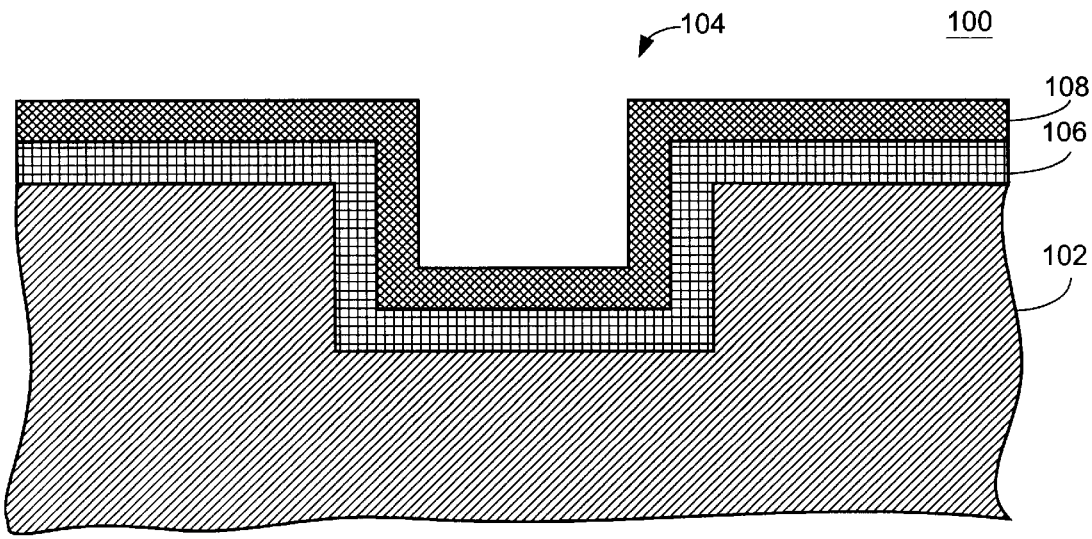

FIGS. 1A–1F illustrate a prior art method of filling a cavity such as a trench or via with a conductive material. FIG. 1A shows a portion 100 of the top portion of a layer 102 of a semiconductor wafer that has just finished a manufacturing process that has formed the layer 102 that has cavities that need to be filled with a conductive material. A trench 104 has been formed in the layer 102 of the semiconductor wafer. A barrier layer 106 has been formed on the exposed surface of the layer 102 including the surfaces of the trench 104. The barrier layer 106 is typically a tantalum nitride or other metallic nitride film. A seed layer 108 has been formed on the surface of the barrier layer 106. The purpose of the seed layer 108 is to provide a material on which a subsequently deposited material will readily form. The seed layer can be formed from copper (Cu) or other material that will provide a suitable surface to which the conductive material will form. Such a material is well known in the semiconductor manufacturing art and a person of ordinary skill in the art will be able to select such a material.

Figure 1B:
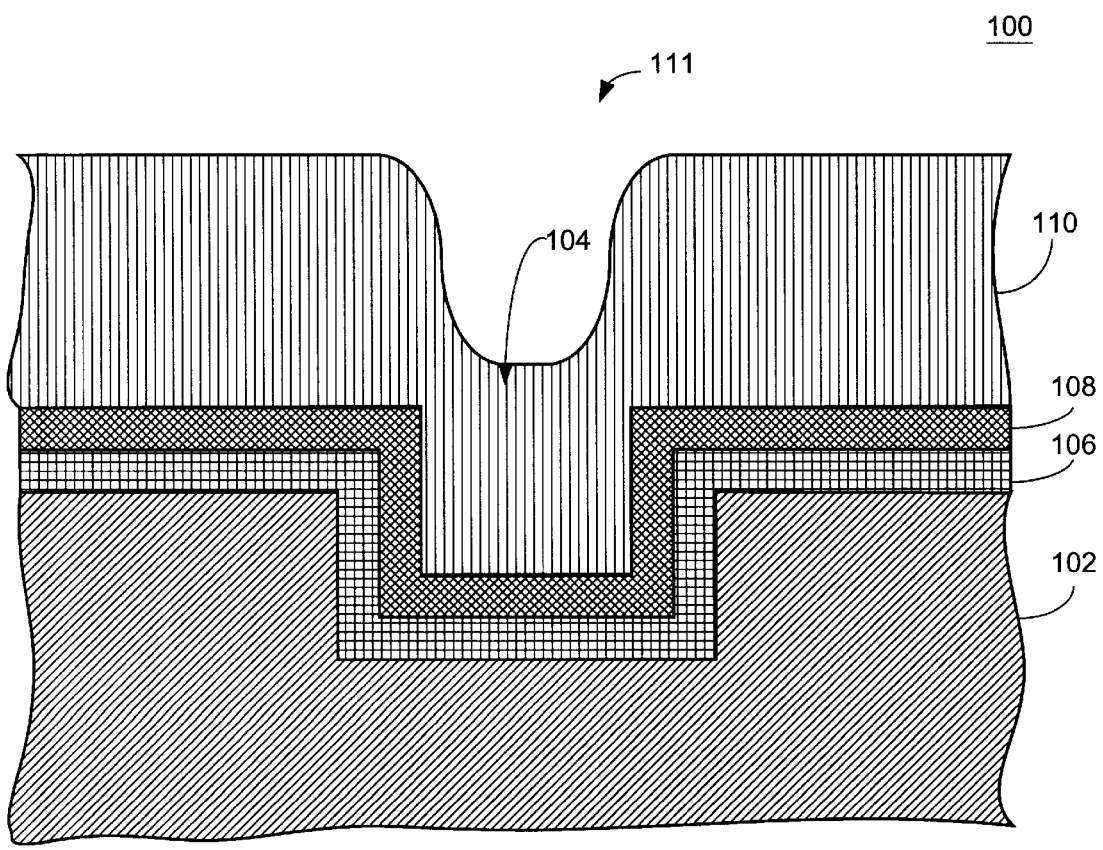

FIG. 1B shows portion 100 of the top portion of a layer 102 of a semiconductor wafer as shown in FIG. 1A with a layer 110 of a conductive material deposited on the seed layer 108. In prior art devices, some conductive materials are relatively easily polished by a chemical mechanical polish (CMP) process. However, some materials such as copper are more difficult to polish by the chemical mechanical polish process. As can be seen in FIG. 1B a large recess 111 is formed over the trench 104. As can be appreciated, in order to fill the trench 104 a relatively large layer 110 of conductive material must be formed. This results in a large amount of metal that must be planarized and it is very difficult to planarize metals such as copper.

Figure 1C:
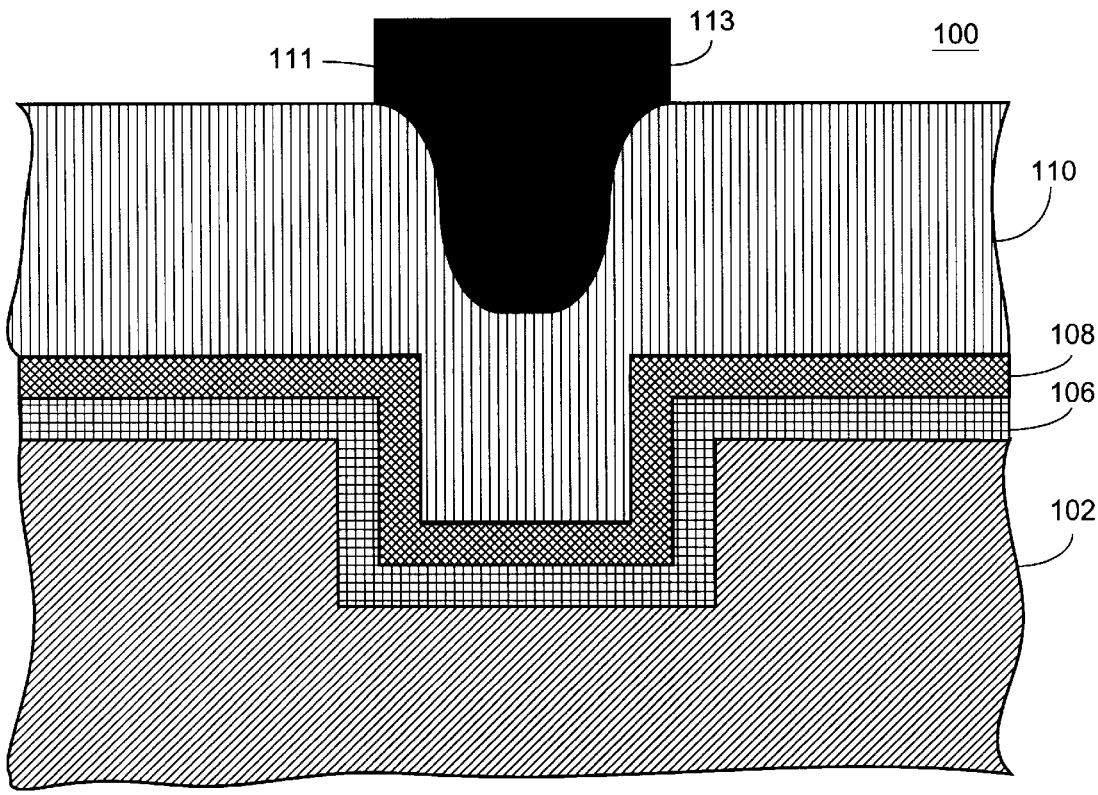

FIG. 1C shows portion 100 of the top portion of a layer 102 of a semiconductor wafer as shown in FIG. 1B with photoresist 113 formed in the recess 111.

Figure 1D:
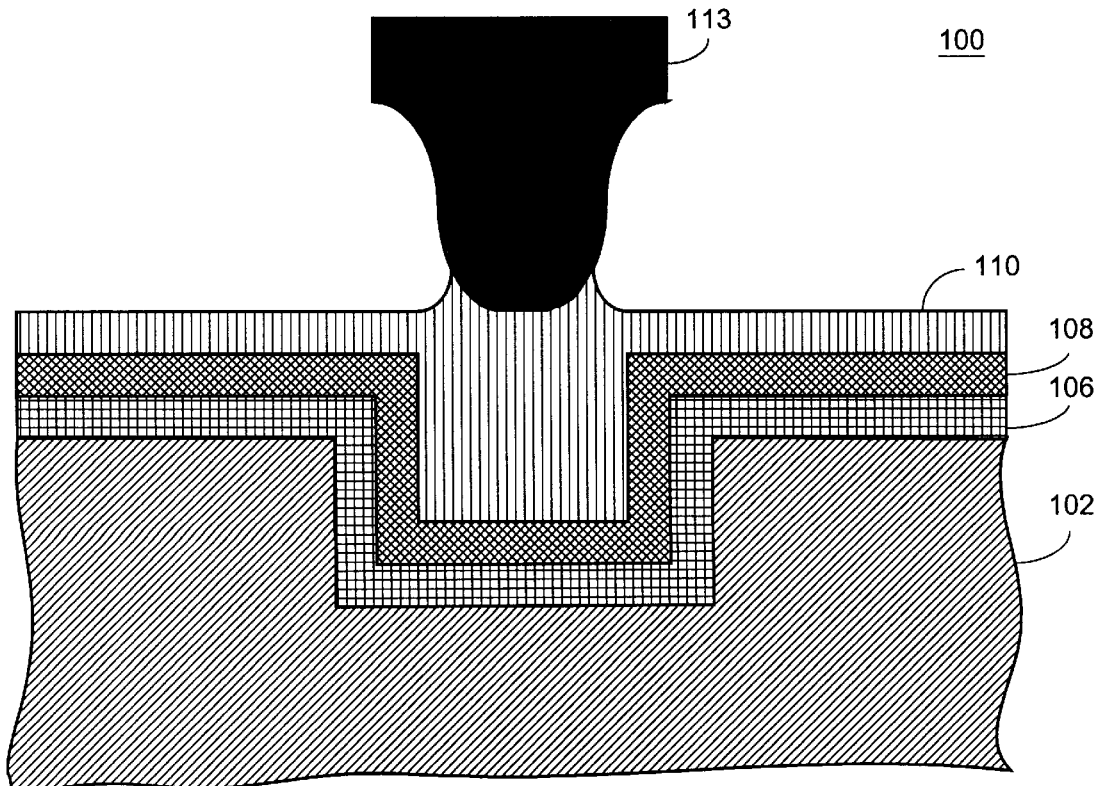

FIG. 1D shows portion 100 of the top portion of the layer 102 of a semiconductor wafer as shown in FIG. 1C after an etch process to remove a portion of the layer 110 of the conductive material. The etch process is typically a corrosive etch process in order to etch the conductive material that is typically a metal such as copper. The etch process is also typically isotropic in order to etch the metal from around the photoresist.

Figure 1E:
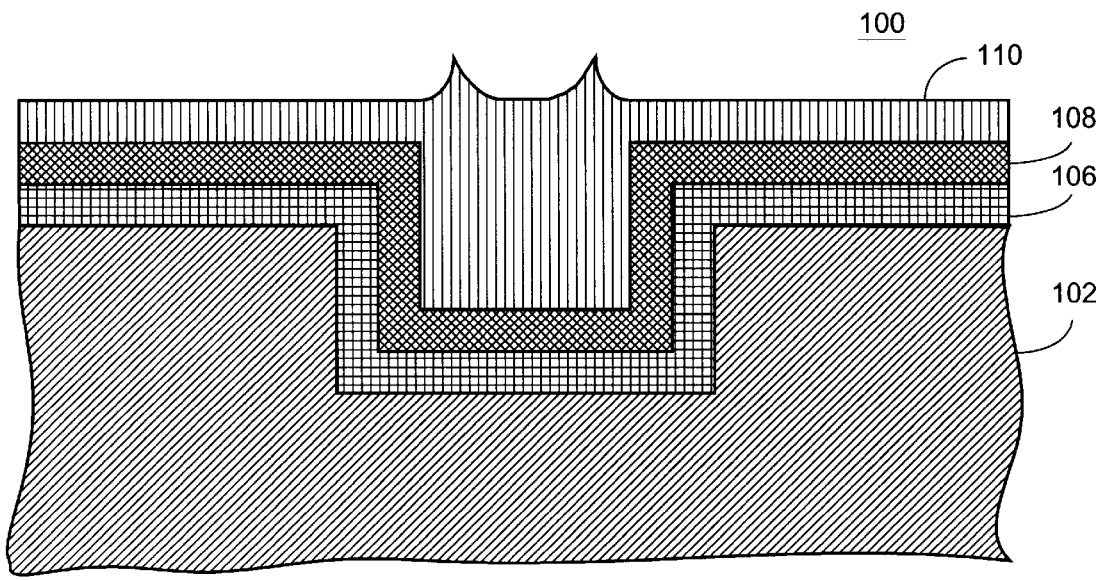

FIG. 1E shows portion 100 of the top portion of the layer 102 of a semiconductor wafer as shown in FIG. 1D with the remaining photoresist removed. Depending upon the process parameters, the thickness of the remaining layer 110 of conductive material can be relatively thin. This makes it easier to planarize.

Figure 1F:
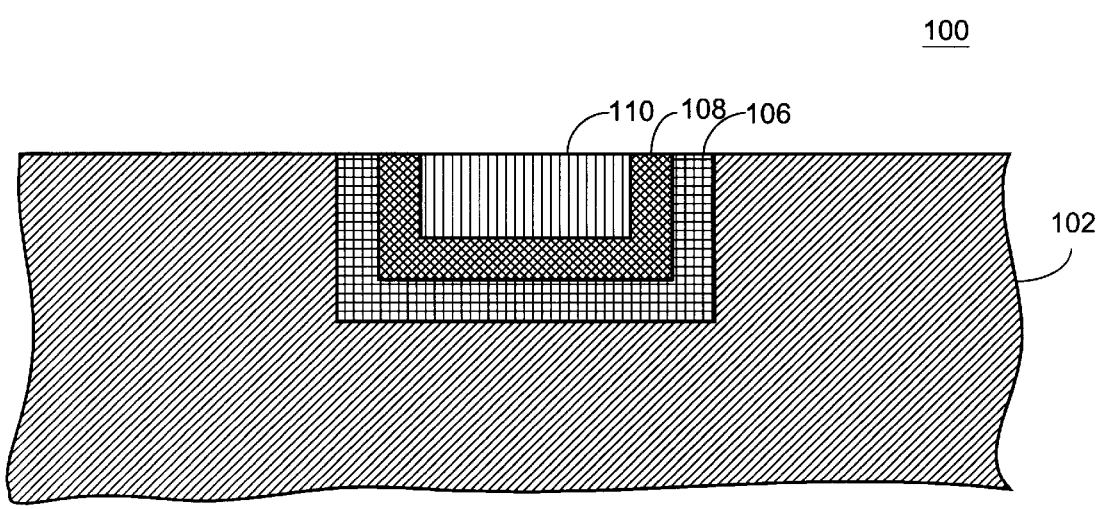

FIG. 1F shows portion 100 of the portion of a layer 102 of a semiconductor wafer as shown in FIG. 1E after a planarization process that removes the excess conductive material and the portions of the seed layer 108 and the barrier layer 106 that were formed on the top surface of the layer 102.

Figure 2A:
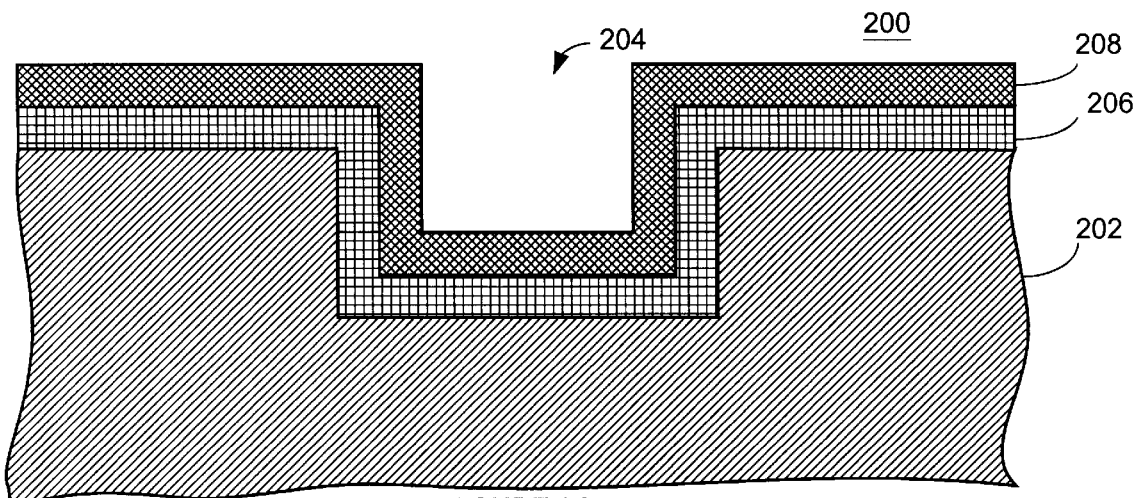

FIGS. 2A–2D illustrate a method of filling a cavity such as a trench or via with a conductive material in accordance with the present invention. FIG. 2A shows a portion 200 of the top portion of a layer 202 of a semiconductor wafer that has just finished a manufacturing process that has formed the layer 202 that has cavities that need to be filled with a conductive material. A trench 204 has been formed in the layer 202 of the semiconductor wafer. A barrier layer 206 has been formed on the exposed surface of the layer 202 including the surfaces of the trench 204. The barrier layer 206 is typically a film of tantalum nitride or other metallic nitride. A seed layer 208 has been formed on the surface of the barrier layer 206. The purpose of the seed layer 208 is to form a layer of material on which a layer of material will form in a subsequent electroplating process. The material from which the seed layer 208 is made depends upon which conductive material is to be used to fill the trench 204. For example, if copper is to be the conductive material used to fill the trench, the seed layer can be a thin layer of copper sputtered onto the surface of the layer 202.

Figure 2B:
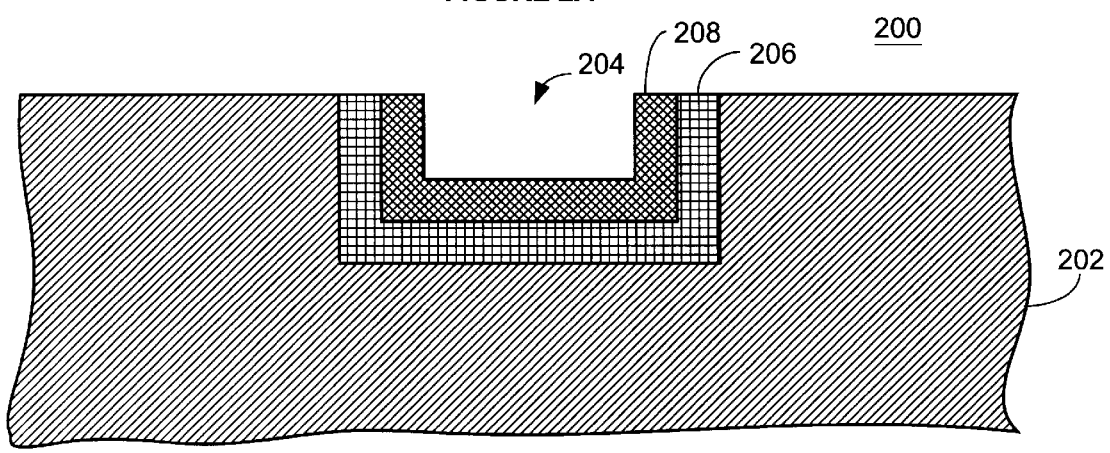

FIG. 2B shows portion 200 of the top portion of a layer 202 of a semiconductor wafer as shown in FIG. 2A after a planarization or buff process has removed the portions of the barrier layer 206 and the seed layer 208 from the top surface of the layer 202.

Figure 2C:
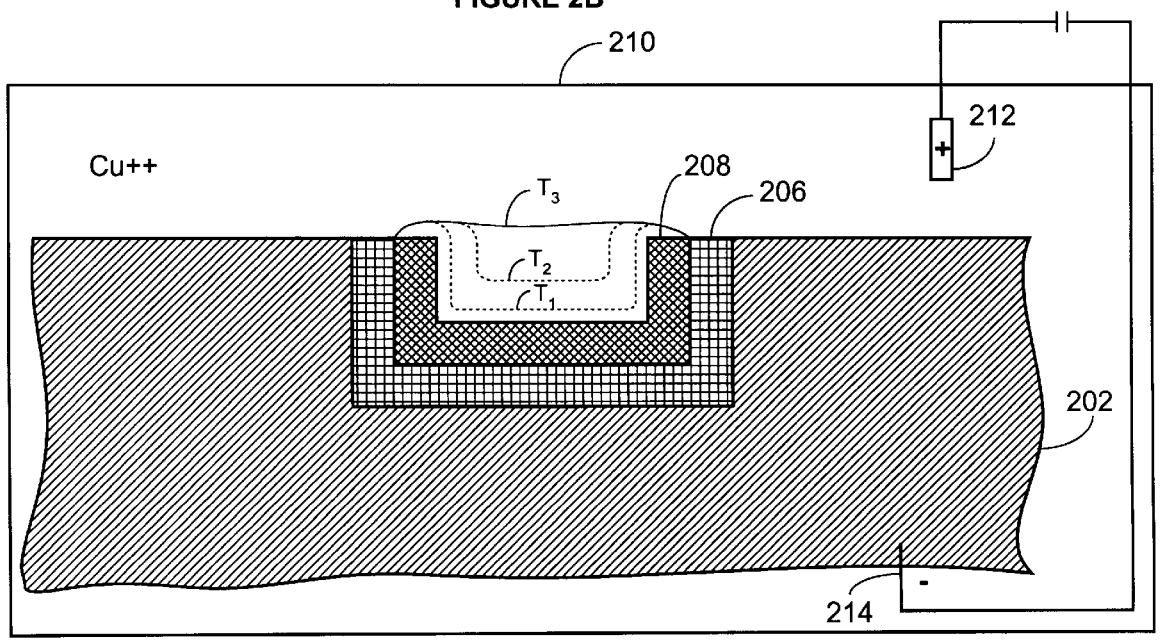

FIG. 2C shows portion 200 of the top portion of a layer 202 of a semiconductor wafer as shown in FIG. 2B submerged in an electroplating solution. The electroplating solution as shown in FIG. 2C shows the electroplating solution containing copper ions ($Cu^{++}$). An anode (+) 212 is placed in the electroplating solution and a cathode (−) 214 is attached to the semiconductor wafer. The lines $T_1$, $T_2$ and $T_3$ are time lines that show the chronological growth of the conductive material in the trench 204. It is noted that the time line $T_3$ indicates that the conductive material forms essentially a flat surface that may not need further planarization.

Figure 2D:
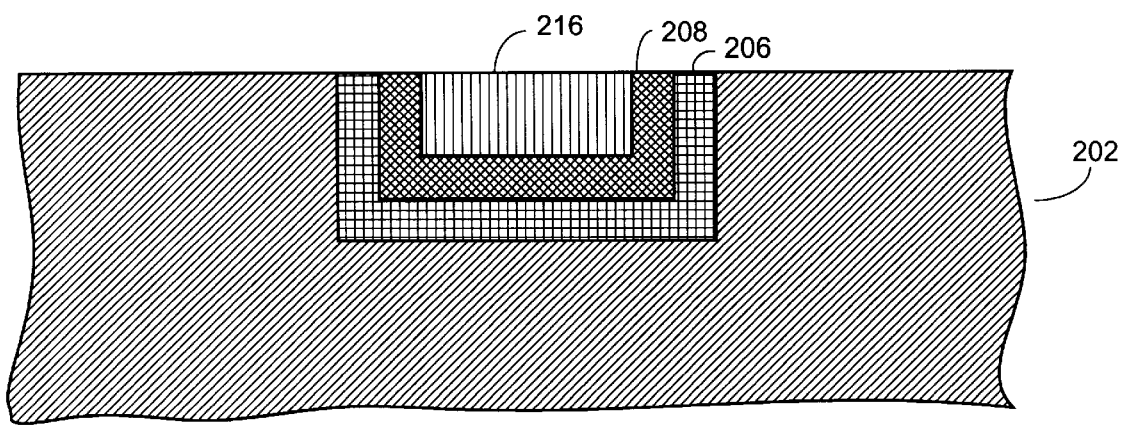

FIG. 2D shows portion 200 of the top portion of a layer 202 of a semiconductor wafer as shown in FIG. 2C after the electroplating process has been completed filling the trench 204 with conductive material 216. As discussed above, the surface of the conductive material may or may not need to be further planarized. However, if necessary a minimum amount of planarization may need to be conducted.

The advantages of the present invention are:

1. It simplifies the process of filling the trenches with a conductive material;
2. It eliminates process steps; and
3. It reduces cost and waste.

In summary, the described method provides an economical method of filling cavities such as trenches in semiconductor wafers.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of filling cavities such as trenches in a semiconductor wafer, the method comprising:

forming at least one cavity in a layer of the semiconductor wafer;

forming a global barrier layer on exposed surfaces of the at least one cavity and exposed surfaces of the semiconductor wafer;

forming a global seed layer on the barrier layer;

removing the seed layer and barrier layer from the exposed surfaces of the semiconductor wafer;

submerging the semiconductor wafer in an electroplating solution after the seed layer and barrier layer is removed from the exposed surfaces of the semiconductor wafer, wherein only the trenches are filled with a conductive material; and applying an electrical potential to the semiconductor wafer and the electroplating solution.

2. The method of claim 1 wherein the electroplating solution includes copper ions.

3. The method of claim 2 wherein the barrier layer is formed from a material selected from the group consisting of a film of tantalum nitride and other metallic nitride.

4. The method of claim 3 wherein the seed layer is formed from a layer of copper.

* * * * *